United States Patent
Sun et al.

(10) Patent No.: US 11,280,670 B2
(45) Date of Patent: Mar. 22, 2022

(54) OPTICAL SENSOR ASSEMBLY

(71) Applicant: PixArt Imaging Inc., Hsin-Chu County (TW)

(72) Inventors: Chih-Ming Sun, Hsin-Chu County (TW); Po-Wei Yu, Hsin-Chu County (TW)

(73) Assignee: PIXART IMAGING INC., Hsin-Chu County (TW)

( * ) Notice: Subject to any disclaimer, the term of this patent is extended or adjusted under 35 U.S.C. 154(b) by 0 days.

(21) Appl. No.: 16/951,065

(22) Filed: Nov. 18, 2020

(65) Prior Publication Data

US 2021/0072073 A1 Mar. 11, 2021

Related U.S. Application Data

(63) Continuation of application No. 16/458,626, filed on Jul. 1, 2019, now Pat. No. 10,871,394.

(60) Provisional application No. 62/714,132, filed on Aug. 3, 2018.

(51) Int. Cl.
*G01J 1/04* (2006.01)
*H05K 1/18* (2006.01)

(52) U.S. Cl.
CPC ........... *G01J 1/0422* (2013.01); *G01J 1/0411* (2013.01); *H05K 1/181* (2013.01); *H05K 2201/10121* (2013.01); *H05K 2201/10151* (2013.01)

(58) Field of Classification Search
CPC ...... G01J 1/0422; G01J 1/0411; H05K 1/181; H05K 2201/10121; H05K 2201/10151
See application file for complete search history.

(56) References Cited

U.S. PATENT DOCUMENTS

| | | | |
|---|---|---|---|
| 8,730,168 B2* | 5/2014 | Moyer | G06F 3/0317 345/163 |
| 2013/0128106 A1* | 5/2013 | Tam | H04N 5/2254 348/374 |
| 2018/0162690 A1 | 6/2018 | Hsu et al. | |
| 2018/0313699 A1 | 11/2018 | Vaiana et al. | |
| 2019/0212060 A1 | 7/2019 | Lintonen et al. | |
| 2020/0124481 A1 | 4/2020 | Forg et al. | |

FOREIGN PATENT DOCUMENTS

| | | |
|---|---|---|
| CN | 101563591 A | 10/2009 |
| CN | 104600065 A | 5/2015 |
| CN | 205879369 U | 1/2017 |

* cited by examiner

*Primary Examiner* — Hugh Maupin
(74) *Attorney, Agent, or Firm* — WPAT, PC

(57) ABSTRACT

An optical sensor assembly is provided. The optical sensor assembly includes a circuit board, an optical sensor positioned on the circuit board, and a front cover attached to the circuit board and covering the optical sensor. The front cover includes an optical element configured to guide or condense an incident light of a predetermined wavelength onto the optical sensor. The front cover is made of polypropylene or polyethylene. The predetermined wavelength is in a range from 8 micrometers to 12 micrometers.

20 Claims, 5 Drawing Sheets

US 11,280,670 B2

OPTICAL SENSOR ASSEMBLY

CROSS REFERENCE TO RELATED APPLICATION

This application is a continuation application of U.S. patent application Ser. No. 16/458,626 filed on Jul. 1, 2019, which claims the priority benefit of U.S. Provisional Application Ser. No. U.S. 62/714,132, filed on Aug. 3, 2018, the full disclosures of which are incorporated herein by reference.

BACKGROUND

1. Field of the Disclosure

This disclosure generally relates to an optical sensor and, more particularly, to an optical sensor assembly.

2. Description of the Related Art

Optical sensors, such as sensors for detecting infra-red light or visible light, are ubiquitous in various electronic devices such as mobile phones and tablet computers. Optical sensors are fragile electronic components that should be protected from water, dust, damage and interference from ambient environment.

SUMMARY

The present disclosure is related to an optical sensor assembly that includes a front cover for accommodating and protecting an optical sensor from various hazards of the ambient environment, and the front cover has an optical element for condensing incident light.

The present disclosure is related to another optical sensor assembly that includes a front cover for accommodating and protecting an optical sensor from various hazards of the ambient environment, and the front cover has an optical element having a tilt angle with respect to a planar frame of the front cover.

The present disclosure is related to another optical sensor assembly that includes a front cover for accommodating and protecting an optical sensor from various hazards of the ambient environment, and the front cover has an optical element parallel to a sensing surface of the optical sensor and configured to guide incident light to the optical sensor.

The present disclosure provides an optical sensor assembly including a circuit board, an optical sensor and a front cover. The optical sensor is positioned on a front surface of the circuit board. The front cover is attached to the front surface of the circuit board, covers the optical sensor and has two wings protruding in opposite directions. The front cover includes an optical element located between the two wings and is configured to condense an incident light of a predetermined wavelength onto the optical sensor. The front cover is made of polypropylene or polyethylene. The predetermined wavelength is in a range from 8 micrometers to 12 micrometers.

The present disclosure further provides an optical sensor assembly including a circuit board, an optical sensor and a front cover. The optical sensor is attached to a front surface of the circuit board. The front cover is attached to the front surface of the circuit board and has two wings protruding in opposite directions from a central cylinder of the front cover. The front cover includes an optical element sealing one opening of the central cylinder, and another opening of the central cylinder forms a receiving cavity for accommodating the optical sensor.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts. The separate embodiments in the present disclosure below may be combined together to achieve superimposed functions.

Figure 1:
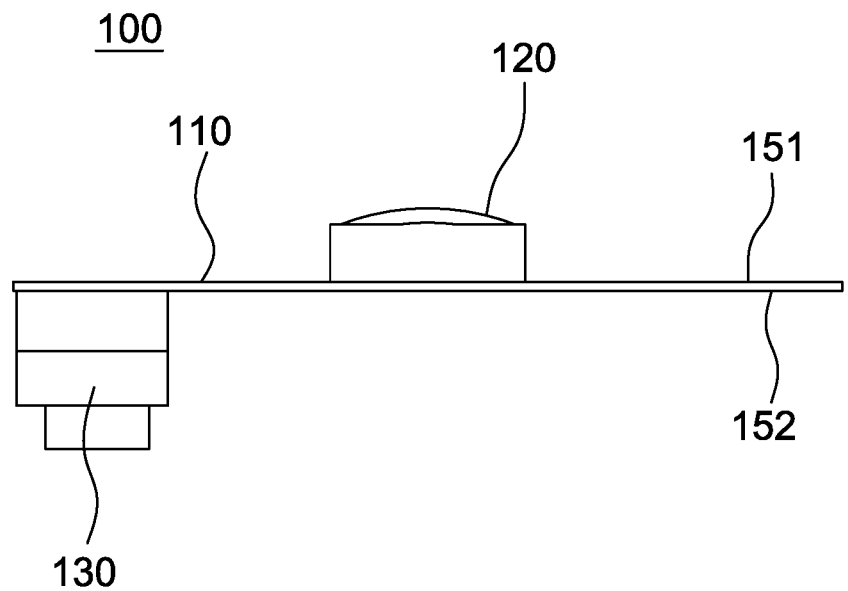
FIGS. 1, 2, 3 and 4 are schematic diagrams of an optical sensor assembly according to one embodiment of the present disclosure.
Figure 2:
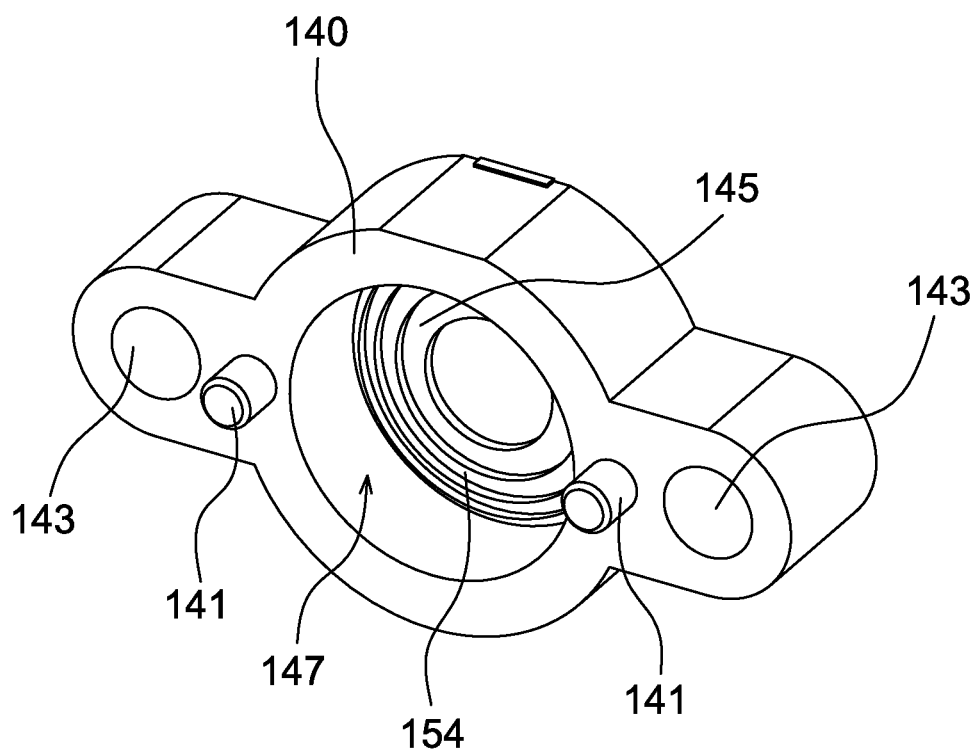
Figure 3:
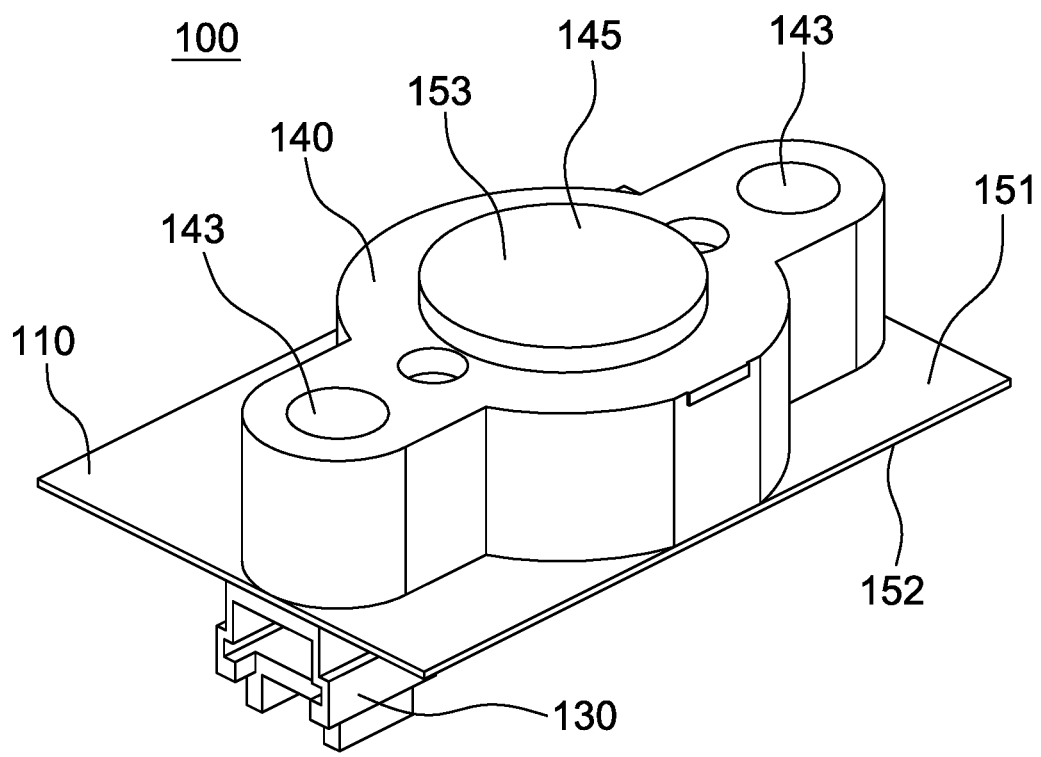
Figure 4:
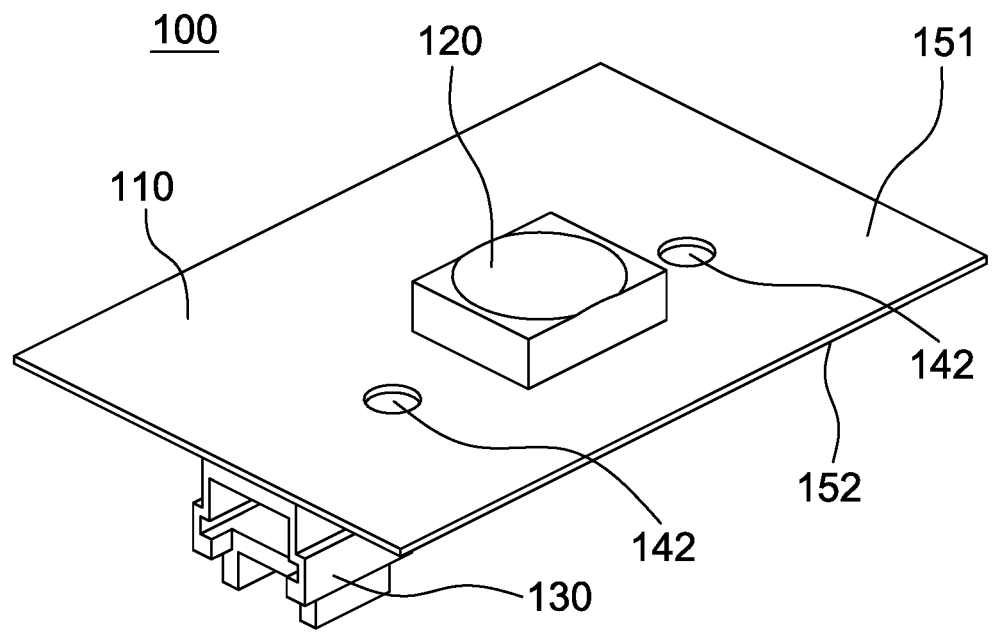

FIGS. 1, 2, 3 and 4 are schematic diagrams of an optical sensor assembly 100 according to one embodiment of the present disclosure. The optical sensor assembly 100 includes a circuit board 110 (e.g., a printed circuit board or a flexible circuit board), an optical sensor 120, a connector 130, and a front cover 140. FIG. 1 is a side view of the circuit board 110, the optical sensor 120, and the connector 130. FIG. 2 is a rear view of the front cover 140. FIG. 3 is a front view of the front cover 140 attached to the circuit board 110. FIG. 4 is another view of the circuit board 110 on which the front cover 140 is not yet attached. The connector 130 is attached to a back surface 152 of the circuit board 110, and the front cover 140 is attached to a front surface 151 of the circuit board 110.

The optical sensor 120 is positioned on and electrically connected to the circuit board 110. The connector 130 is positioned on the circuit board 110. The connector 130 is used to transmit electrical signals to and from the optical sensor 120. In addition, the connector 130 is used to transmit electrical signals between the optical sensor 120 and an external electronic device that adopts the optical sensor assembly 100. The front cover 140 is attached to the circuit board 110 and covers the optical sensor 120. The front cover 140 includes an optical element 145 used to allow incident light of a predetermined wavelength to transmit through the optical element 145 and condense the incident light onto the optical sensor 120. The optical element 145 is a convex lens or a Fresnel lens.

In one embodiment, an outer surface 153 of the optical element 145 is a plane surface, and the convex lens or the Fresnel lens is formed at an inner surface 154 of the optical element 145.

However, the present disclosure is not limited thereto. In one non-limiting aspect, the optical element 145 is a transparent layer used to guide incident light to the optical sensor 120 without condensing or diverging the incident light.

It should be mentioned that although FIG. 3 shows that the outer surface 153 of the optical element 145 is substantially parallel to the front surface 151 of the circuit board 110, the present disclosure is not limited thereto. According to an incident direction of the incident light, the outer surface 153 of the optical element 145 is preferably tilted to be perpendicular to the incident direction.

In one embodiment, the front cover 140, including the optical element 145, is made of polypropylene or polyethylene. The whole front cover 140, including the optical element 145, is produced via injection molding as a single piece. However, the present disclosure is not limited thereto. In one non-limiting aspect, the optical element 145 is formed separately from the front cover 140, and then squeezed into the front cover 140.

In another embodiment, the optical element 145 includes at least one of a polypropylene film, a polyethylene film, a silicon film, a germanium film, and a diamond-like carbon film.

In one embodiment, the optical sensor 120 is a far infra-red thermal sensor used to detect a temperature of a thermal source. The aforementioned predetermined wavelength of the incident light is in a range from 8 micrometers to 12 micrometers, and the optical element 145 is used to allow the incident light to transmit through the optical element 145 with a transmittance in a range from 20% to 80%.

In another embodiment, the optical sensor 120 is an ambient light sensor. The aforementioned predetermined wavelength of the incident light is in a range from 390 nanometers to 700 nanometers.

The optical sensor 120 generates electrical signals by detecting the incident light penetrating the optical element 145. The connector 130 transmits the electrical signals to a processor of an electronic device for predetermined control.

In one non-limiting aspect, the front cover 140 further includes at least one alignment peg 141 (e.g., two alignment pegs 141 being shown in FIG. 2), and the circuit board 110 includes at least one alignment hole 142 (e.g., two alignment hole 142 being shown in FIG. 3) used to receive the at least one alignment peg 141, and the at least one alignment peg 141 is formed integrally with the front cover 140. The front cover 140 further includes at least one screw hole 143 used to receive at least one screw for attaching and fixing the front cover 140 to the circuit board 110.

In the embodiment shown in FIGS. 2, 3 and 4, the front cover 140 includes two alignment pegs 141 and two screw holes 143, and the circuit board 110 includes two alignment holes 142. In another embodiment, the front cover 140 includes more or less alignment pegs 141 and more or less screw holes 143, and the circuit board 110 includes more or less alignment holes 142.

The front cover 140 further includes a receiving cavity 147 used to accommodate the optical sensor 120 attached on the circuit board 110. The front cover 140 is attached to the circuit board 110 via a water-proof and dust-proof adhesive, so that the circuit board 110, the adhesive, and the front cover 140 around the receiving cavity 147 form a sealed enclosure for accommodating and protecting the optical sensor 120 from various hazards of the ambient environment, such as water, dust, electrical damage and mechanical damage. In the aspect that the front cover 140 is combined with the circuit board 110 via adhesive, the at least one screw hole 143 is not implemented.

It should be mentioned that although the front cover 140 is shown to have curved edges between two protruding ends, it is only to illustrate but not to limit the present disclosure. In other embodiments, the front cover 140 has other shapes such as a rectangular shape according to a receiving opening of the electronic device adopting the optical sensor assembly 100.

Figure 5:
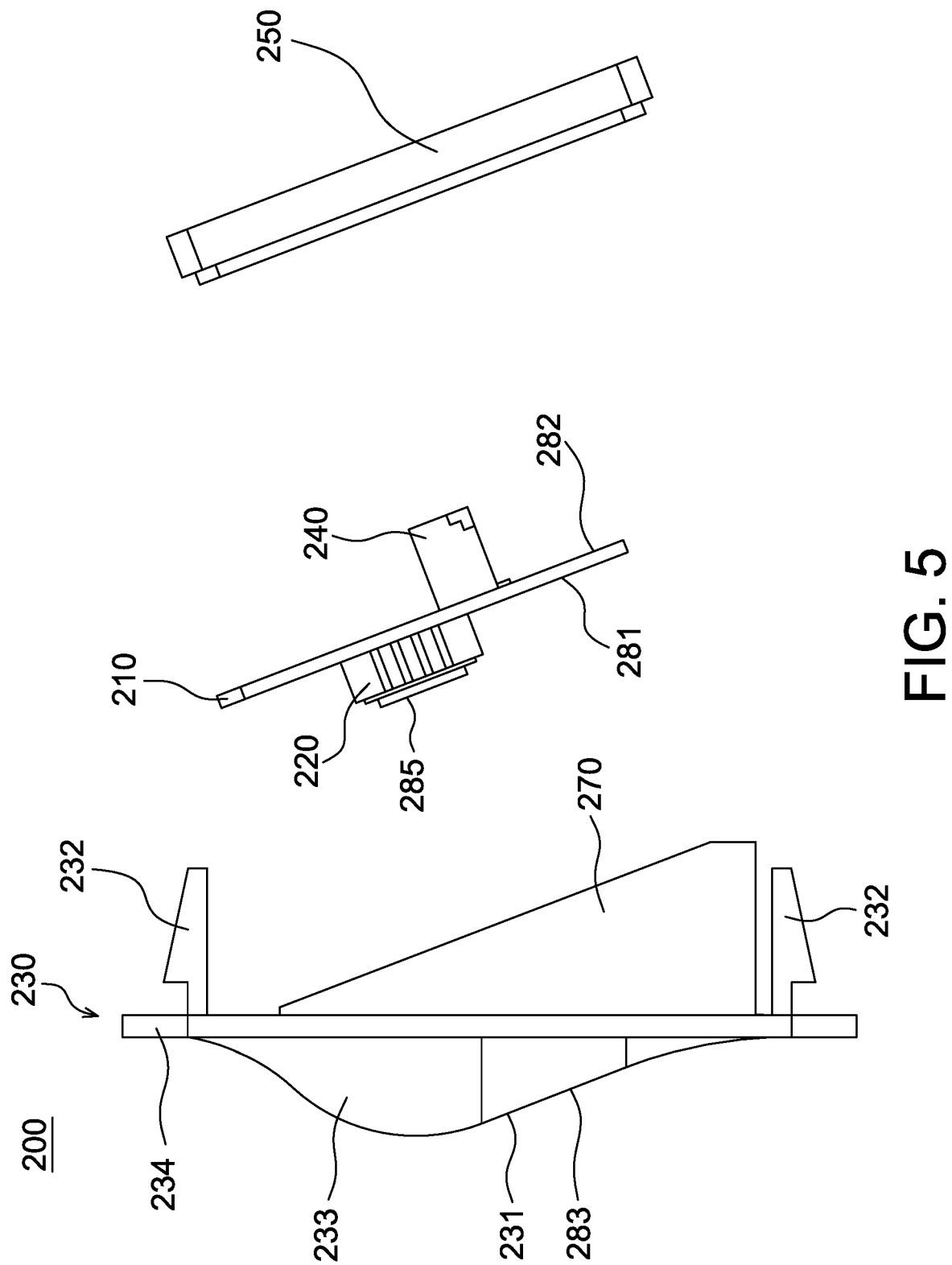
FIGS. 5, 6 and 7 are schematic diagrams of an optical sensor assembly according to another embodiment of the present disclosure.
Figure 6:
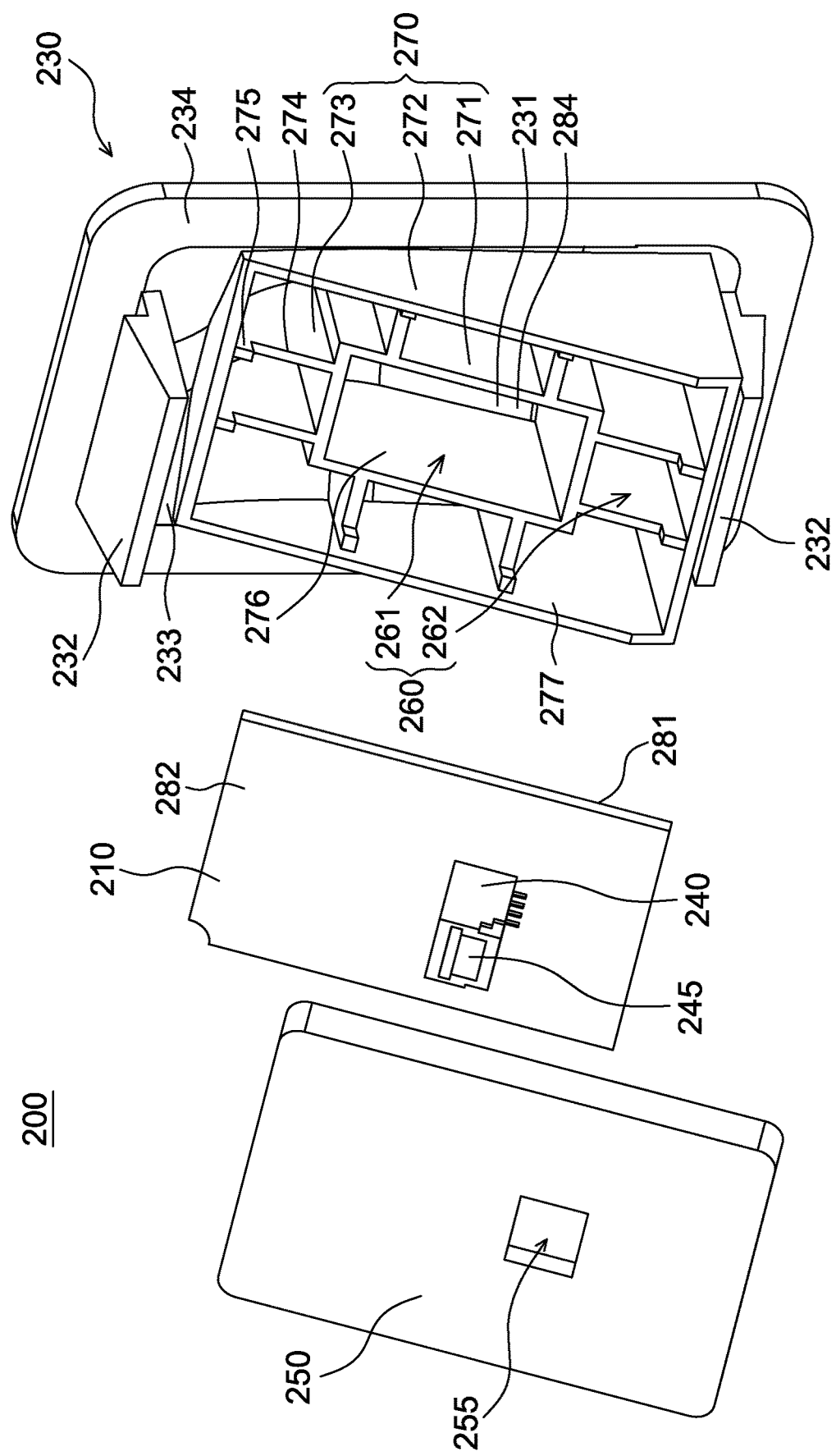
Figure 7:
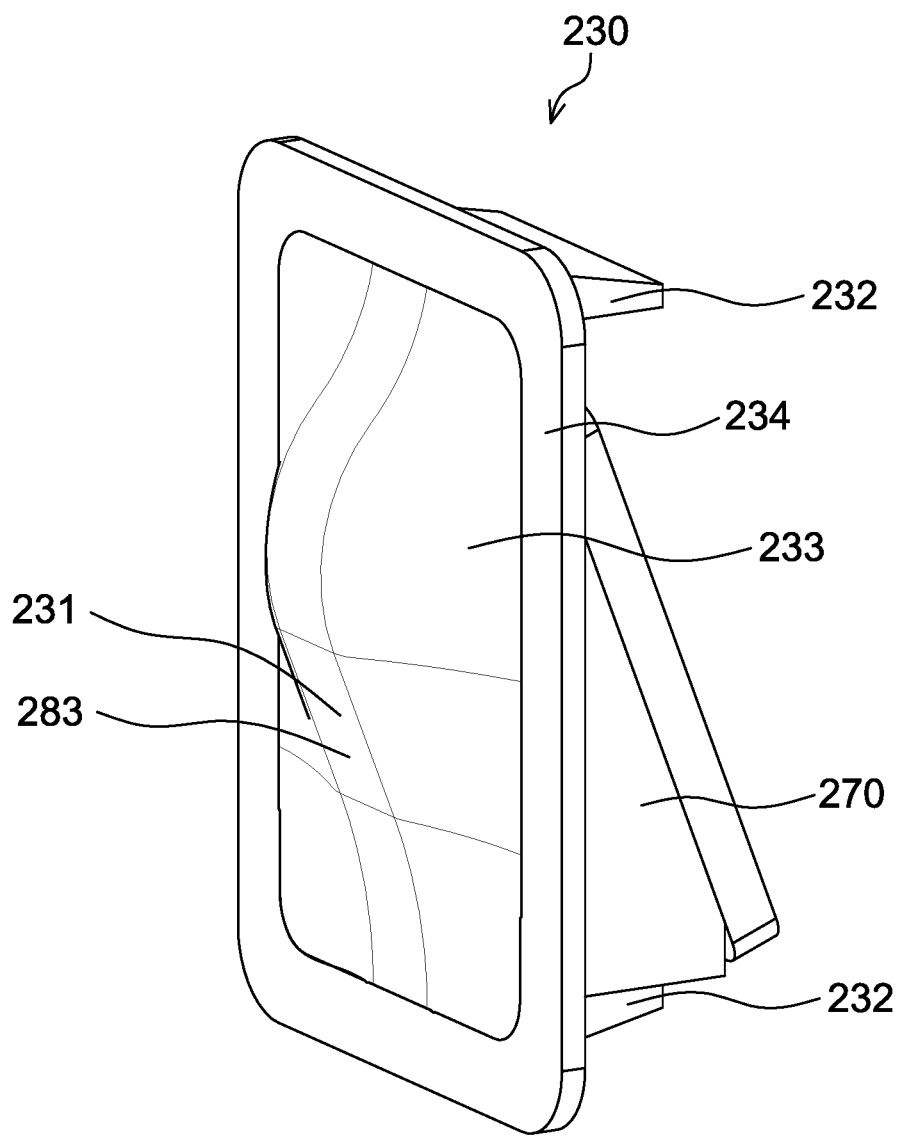

FIGS. 5, 6 and 7 are schematic diagrams of an optical sensor assembly 200 according to another embodiment of the present disclosure. The optical sensor assembly 200 includes a circuit board 210 (e.g., a printed circuit board or a flexible circuit board), an optical sensor 220, a connector 240, a front cover 230, and a back cover 250. FIG. 5 is a side view of the circuit board 210, the optical sensor 220, the connector 240, the front cover 230, and the back cover 250. FIG. 6 is a rear view of the circuit board 210, the connector 240, the front cover 230, and the back cover 250. FIG. 7 is a front view of the front cover 230.

In one non-limiting embodiment, when the circuit board 210 is fixed or sealed well with the front cover 230 to prevent dust and water from contacting the optical sensor 220, the back cover 250 is not implemented.

The optical sensor 220 is attached to a front surface 281 of the circuit board 210, and the optical sensor 220 is electrically connected with the circuit board 210. The front cover 230 includes a receiving cavity 260 used to receive at least the optical sensor 220. In one non-limiting embodiment, the receiving cavity 260 receives both the circuit board 210 and the optical sensor 220. The front cover 230 further includes an optical element 231 used to allow incident light of a predetermined wavelength to transmit through the optical element 231 and condense the incident light onto the optical sensor 220. The optical element 231 is a convex lens or a Fresnel lens.

In one embodiment, an outer surface 283 of the optical element 231 is a plane surface, and the convex lens or the Fresnel lens is formed at an inner surface 284 of the optical element 231.

However, the present disclosure is not limited thereto. In one non-limiting aspect, the optical element 231 is a transparent layer used to guide incident light to the optical sensor 220 without condensing or diverging the incident light.

In one embodiment, the optical sensor 220 is a far infra-red thermal sensor used to detect a temperature of a thermal source. The aforementioned predetermined wavelength of the incident light is in a range from 8 micrometers to 12 micrometers, and the optical element 231 is used to allow the incident light to transmit through the optical element 231 with a transmittance in a range from 20% to 80%.

In another embodiment, the optical sensor 220 is an ambient light sensor. The aforementioned predetermined wavelength of the incident light is in a range from 390 nanometers to 700 nanometers.

The front cover 230 further includes a curved sheet 233, a planar frame 234 connected to and surrounding the curved sheet 233, and a wall structure 270 positioned on the curved sheet 233. In another embodiment, the wall structure 270 is connected to the planar frame 234. The receiving cavity 260 is positioned in and formed by the wall structure 270. The optical element 231 is a part of the curved sheet 233. In one embodiment, the curved sheet 233 has a plane surface within a region of the optical element 231, and the rest part of the curved sheet 233 has a curved surface.

The optical sensor 220 is aligned with the optical element 231. Preferably, the optical element 231 is parallel to a sensing surface 285 of the optical sensor 220. In one aspect, the whole curved sheet 233 is transparent to the incident light. In another aspect, the curved sheet 233 is transparent to the incident light only within a region of the optical element 231, and the rest part of the curved sheet 233 is opaque or semi-opaque to the incident light.

In one embodiment, the optical element 231 and the optical sensor 220 are neither parallel nor perpendicular to the planar frame 234, as shown in FIG. 5. The angle difference between the planar frame 234 and the optical element 231 is determined based on design requirements of the optical sensor assembly 200.

In another embodiment, the optical element 231 and the optical sensor 220 are parallel to the planar frame 234. The optical element 231 is a part of the curved sheet 233. The circuit board 210 is attached to the wall structure 270. The shapes of the curved sheet 233 and the wall structure 270 are arranged such that the optical element 231, the optical sensor 220, and the circuit board 210 (determined by a tile angle of the outer loop wall 272) are all parallel. When the tile angle is changed, a light receiving angle of the optical element 231 and optical sensor 220 is also altered.

The wall structure 270 includes an inner loop wall 271 surrounding the optical element 231 and an outer loop wall 272 surrounding the inner loop wall 271. The inner loop wall 271 and the outer loop wall 272 have different heights at different edges of the front cover 230, e.g., lower at an upper edge and higher at a lower edge to cause the optical sensor 220 to have an angle difference with respect to the planar frame 234.

One end of the inner loop wall 271 is connected to the curved sheet 233 and another end of the inner loop wall 271 has an opening 276. One end of the outer loop wall 272 is connected to the curved sheet 233 and another end of the outer loop wall 272 has an opening 277. The area of the circuit board 210 is between the area of the opening 276 of the inner loop wall 271 and the area of the opening 277 of the outer loop wall 272. In other words, the area of the circuit board 210 is larger than the area of the opening 276 of the inner loop wall 271, and the area of the circuit board 210 is smaller than the area of the opening 277 of the outer loop wall 272 so as to be accommodated in the outer loop wall 272.

The receiving cavity 260 includes a first cavity 261 for receiving the optical sensor 220 and a second cavity 262 for receiving the circuit board 210. The first cavity 261 is positioned in the inner loop wall 271. The second cavity 262 is positioned in the outer loop wall 272.

To enhance the mechanical strength, the wall structure 270 further includes a plurality of ridge walls 273 connecting the inner loop wall 271, the outer loop wall 272 and the curved sheet 233. Each of the ridge walls 273 has an indent 274 on an edge 275 of that ridge wall 273 connecting the inner loop wall 271 and the outer loop wall 272. The second cavity 262 is formed by the indents 274 of all of the ridge walls 273.

In one non-limiting embodiment, the indents 274 and the second cavity 262 are not implemented. In this case, the circuit board 210 is attached to the inner loop wall 271 and the ridge walls 273 to seal the first cavity 261.

In one non-limiting embodiment, the ridge walls 273 are not implemented. In this case, the opening 277 of the outer loop wall 272 defines the second cavity 262.

In one non-limiting embodiment, the inner loop wall 271 is not implemented. In another one non-limiting embodiment, the outer loop wall 272 is not implemented. In another one non-limiting embodiment, both of the inner loop wall 271 and the outer loop wall 272 are not implemented.

According to FIG. 6, there are spaces between the ridge walls 273, the inner loop wall 271 and the outer loop wall 272. However, the present disclosure is not limited thereto. In one non-limiting embodiment, the ridge walls 273 fill all the spaces between the inner loop wall 271 and the outer loop wall 272 so that the wall structure 270 is a thick and solid loop wall surrounding the optical element 231 and the first cavity 261.

In one embodiment, the front cover 230, including the optical element 231, is made of polypropylene or polyethylene. The front cover 230, including the optical element 231 and the wall structure 270, is produced via injection molding as a single piece. However, the present disclosure is not limited thereto. In one non-limiting aspect, the optical element 231 is formed separately and has different materials from the front cover 230, and then combined with the front cover 230.

In another embodiment, the optical element 231 includes at least one of a polypropylene film, a polyethylene film, a silicon film, a germanium film, and a diamond-like carbon film.

The connector 240 is attached to a back surface 282 of the circuit board 210, and the connector 240 is electrically connected to the circuit board 210. The connector 240 is used to transmit electrical signals to and from the optical sensor 220. In addition, the connector 240 is used to transmit electrical signals between the optical sensor 220 and an external electronic device that adopts the optical sensor assembly 200. The back cover 250 is attached to the outer loop wall 272, for example, via a water-proof and dust-proof adhesive. The back cover 250 is used to seal the opening 277 of the outer loop wall 272. The back cover 250 has an opening 255 used to expose an end 245 of the connector 240.

The optical sensor 220 generates electrical signals by detecting the incident light penetrating the optical element 231. The connector 240 transmits the electrical signals to a processor of an electronic device for predetermined control.

In one embodiment, the circuit board 210 is attached to the inner loop wall 271 and the ridge walls 273, for example, via a water-proof and dust-proof adhesive. In this way, the circuit board 210, the inner loop wall 271, the curved sheet 233, and the optical element 231 form a sealed enclosure for accommodating and protecting the optical sensor 220 from various hazards of the ambient environment, such as water, dust, electrical damage and mechanical damage. The outer loop wall 272 and the back cover 250 provide additional protection for the optical sensor 220 against the hazards of the ambient environment.

In one embodiment, the optical sensor assembly 200 is applied to an electronic device. The front cover 230 further includes at least one latching hook 232 configured for attaching the optical sensor assembly 200 to the other parts of the electronic device. In the embodiment shown in FIGS. 5, 6 and 7, the front cover 230 includes two latching hooks 232. In another embodiment, the front cover 230 includes more or less latching hooks 232.

In one non-limiting embodiment, the optical sensor assembly 200 is attached to the electronic device by other means such as screws or adhesive, and the at least one latching hook 232 is not implemented.

It should be mentioned that although the front cover 230 is shown to have a rectangular appearance, it is only to illustrate but not to limit the present disclosure. In other embodiments, the front cover 230 has other shapes such as a circular or ellipse shape according to a receiving opening of the electronic device adopting the optical sensor assembly 200.

In the present disclosure, the type of the connector 130 and 240 is not particularly limited as long as it is combinable to another connector of an electronic device that adopts the optical sensor assembly a00 and 200.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. An optical sensor assembly, comprising:
a circuit board;
an optical sensor positioned on a front surface of the circuit board; and
a front cover attached to the front surface of the circuit board, covering the optical sensor and having two wings protruding in opposite directions, wherein
the front cover comprises an optical element located between the two wings and configured to condense an incident light of a predetermined wavelength onto the optical sensor,
the front cover is made of polypropylene or polyethylene, and
the predetermined wavelength is in a range from 8 micrometers to 12 micrometers.

2. The optical sensor assembly of claim 1, wherein the optical element has a transmittance in a range from 20% to 80%.

3. The optical sensor assembly of claim 1, wherein the front cover is produced via injection molding as a single piece.

4. The optical sensor assembly of claim 1, wherein the optical element comprises at least one of a polypropylene film, a polyethylene film, a silicon film, a germanium film, and a diamond-like carbon film.

5. The optical sensor assembly of claim 1, wherein the optical element comprises a convex lens or a Fresnel lens, and the convex lens or the Fresnel lens is located at an inner surface of the optical element.

6. The optical sensor assembly of claim 5, wherein an outer surface of the optical element is a convex surface or a plane surface.

7. The optical sensor assembly of claim 1, wherein
the front cover further comprises:
at least one alignment peg located between the optical element and the two wings, and
at least one screw hole located at the two wings and configured to receive at least one screw for attaching the front cover to the circuit board, and
the circuit board comprises at least one alignment hole configured to receive the at least one alignment peg.

8. The optical sensor assembly of claim 1, wherein
the front cover further comprises a receiving cavity configured to accommodate the optical sensor, and
the front cover is attached to the circuit board via adhesive.

9. The optical sensor assembly of claim 1, further comprising a connector positioned on a back surface of the circuit board and configured to transmit electrical signals to and from the optical sensor.

10. The optical sensor assembly of claim 1, wherein the optical sensor is a far infra-red thermal sensor or an ambient light sensor.

11. An optical sensor assembly, comprising:
a circuit board;
an optical sensor attached to a front surface of the circuit board; and
a front cover attached to the front surface of the circuit board and having two wings protruding in opposite directions from a central cylinder of the front cover, wherein the front cover comprises an optical element sealing one opening of the central cylinder, and another opening of the central cylinder forms a receiving cavity for accommodating the optical sensor.

12. The optical sensor assembly of claim 11, wherein the front cover is configured to condense an incident light of wavelengths within 8 micrometers and 12 micrometers.

13. The optical sensor assembly of claim 11, wherein the front cover is made of polypropylene or polyethylene, and has a transmittance in a range from 20% to 80%.

14. The optical sensor assembly of claim 11, wherein the optical element comprises at least one of a polypropylene film, a polyethylene film, a silicon film, a germanium film, and a diamond-like carbon film.

15. The optical sensor assembly of claim 11, wherein the optical element comprises a convex lens or a Fresnel lens located at an inner surface of the optical element.

16. The optical sensor assembly of claim 15, wherein an outer surface of the optical element is a convex surface or a plane surface.

17. The optical sensor assembly of claim 1, wherein
the front cover further comprises:
two alignment pegs respectively located between the optical element and the two wings, and
two screw holes respectively located at the two wings and configured to receive two screws for fixing the front cover to the circuit board, and
the circuit board comprises two alignment holes configured to receive the two alignment pegs.

18. The optical sensor assembly of claim 11, further comprising a connector positioned on a back surface of the circuit board and configured to transmit electrical signals to and from the optical sensor.

19. The optical sensor assembly of claim 11, wherein the optical sensor is a far infra-red thermal sensor or an ambient light sensor.

20. The optical sensor assembly of claim 11, wherein the front cover is produced via injection molding as a single piece.

* * * * *